(12) United States Patent
Yoshikawa

(10) Patent No.: US 10,886,293 B2
(45) Date of Patent: Jan. 5, 2021

(54) SEMICONDUCTOR DEVICE AND METHOD OF FABRICATING THE SAME

(71) Applicant: TOSHIBA MEMORY CORPORATION, Tokyo (JP)

(72) Inventor: Kenichi Yoshikawa, Yokkaichi Mie (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 16/230,244

(22) Filed: Dec. 21, 2018

(65) Prior Publication Data
US 2019/0148402 A1    May 16, 2019

Related U.S. Application Data

(63) Continuation-in-part of application No. 15/909,371, filed on Mar. 1, 2018.

(30) Foreign Application Priority Data

Sep. 7, 2017 (JP) .................................. 2017-172184
Jul. 3, 2018 (JP) .................................. 2018-127050

(51) Int. Cl.
*H01L 21/8234* (2006.01)
*H01L 27/11582* (2017.01)
*H01L 21/3213* (2006.01)
*H01L 21/3205* (2006.01)
*H01L 21/311* (2006.01)
*H01L 27/1157* (2017.01)

(52) U.S. Cl.
CPC .. *H01L 27/11582* (2013.01); *H01L 21/31144* (2013.01); *H01L 21/32051* (2013.01); *H01L 21/32136* (2013.01); *H01L 21/823475* (2013.01); *H01L 21/823487* (2013.01); *H01L 27/1157* (2013.01)

(58) Field of Classification Search
CPC .......... H01L 21/31144; H01L 21/3116; H01L 21/32051; H01L 21/3213; H01L 21/32136; H01L 21/823475; H01L 21/823487; H01L 27/1157; H01L 27/11582; H01L 27/11556; H01L 27/11575

See application file for complete search history.

(56) References Cited

U.S. PATENT DOCUMENTS 7,595,236 B2    9/2009    Isogai
8,696,875 B2    4/2014    Ding et al.
(Continued)

OTHER PUBLICATIONS

Notice of Allowance on U.S. Appl. No. 15/909,371 dated Mar. 30, 2020.

*Primary Examiner* — Joseph M Galvin, III

(74) *Attorney, Agent, or Firm* — Foley & Lardner LLP

(57) ABSTRACT

A method of fabricating a semiconductor device includes: forming alternately a plurality of first films and a plurality of second films on a substrate, forming a hole in the first and second films, forming a first metal layer on a surface of the hole, and removing the first metal layer from a bottom of the hole. The method further includes forming a second metal layer on a surface of the first metal layer after removing the first metal layer from the bottom of the hole. The method further includes processing the bottom of the hole exposed from the first and second metal layers to increase a depth of the hole.

18 Claims, 9 Drawing Sheets

(56) References Cited

U.S. PATENT DOCUMENTS

| | | |
|---|---|---|
| 9,281,217 B1 | 3/2016 | Jung et al. |
| 9,496,274 B2 | 11/2016 | Pachamuthu et al. |
| 9,929,177 B2 | 3/2018 | Nagumo |
| 2006/0003577 A1 | 1/2006 | Sone |
| 2009/0275202 A1 | 11/2009 | Tanaka et al. |
| 2012/0199949 A1* | 8/2012 | Lan ................ H01G 4/012 |
| | | 257/534 |
| 2014/0273462 A1* | 9/2014 | Simsek-Ege ...... H01L 29/66825 |
| | | 438/696 |
| 2015/0357413 A1* | 12/2015 | Zhang .............. H01L 27/1157 |
| | | 257/324 |
| 2017/0250193 A1 | 8/2017 | Huo |
| 2017/0263611 A1* | 9/2017 | Imamura ........... H01L 21/31138 |
| 2017/0330764 A1* | 11/2017 | Lai .................. H01J 37/32082 |

\* cited by examiner

US 10,886,293 B2

SEMICONDUCTOR DEVICE AND METHOD OF FABRICATING THE SAME

CROSS-REFERENCE TO RELATED APPLICATION

This application is a continuation in part application of U.S. application Ser. No. 15/909,371, filed Mar. 1, 2018, which is based upon and claims the benefit of priority from Japanese Patent Application No. 2017-172184, filed Sep. 7, 2017, the entire contents of which are incorporated herein by reference. This application further is based upon and claims the benefit of priority from Japanese Patent Application No. 2018-127050, filed Jul. 3, 2018, the entire contents of which are incorporated herein by reference.

FIELD

Embodiments described herein relate generally to a semiconductor device and a method of fabricating the same.

BACKGROUND

In recent years, there are many cases of processing holes with a high aspect ratio during fabricating a three-dimensional semiconductor memory. In this case, there is a problem that the hole is deformed in an arcuate shape (bowing shape) as the processing time increases. For this reason, it is conceivable to form a protective film on a surface of the hole at the time of processing the hole. However, when etching resistance of the protective film is too low, the protective film may be chipped off; and when the etching resistance of the protective film is too high, the protective film may block the hole.

DETAILED DESCRIPTION

Exemplary embodiments provide a semiconductor device capable of appropriately providing a structure with a high aspect ratio and a method of fabricating the same.

In general, according to at least one embodiment, a method of fabricating a semiconductor device includes: forming alternately a plurality of first films and a plurality of second films on a substrate; forming a hole in the first and second films; forming a first metal layer on a surface of the hole; and removing the first metal layer from a bottom of the hole. The method further includes forming a second metal layer on a surface of the first metal layer after removing the first metal layer from the bottom of the hole. The method further includes processing the bottom of the hole exposed from the first and second metal layers to increase a depth of the hole.

Exemplary embodiments of the present disclosure will be described with reference to the drawings.

First Embodiment

Figure 1:
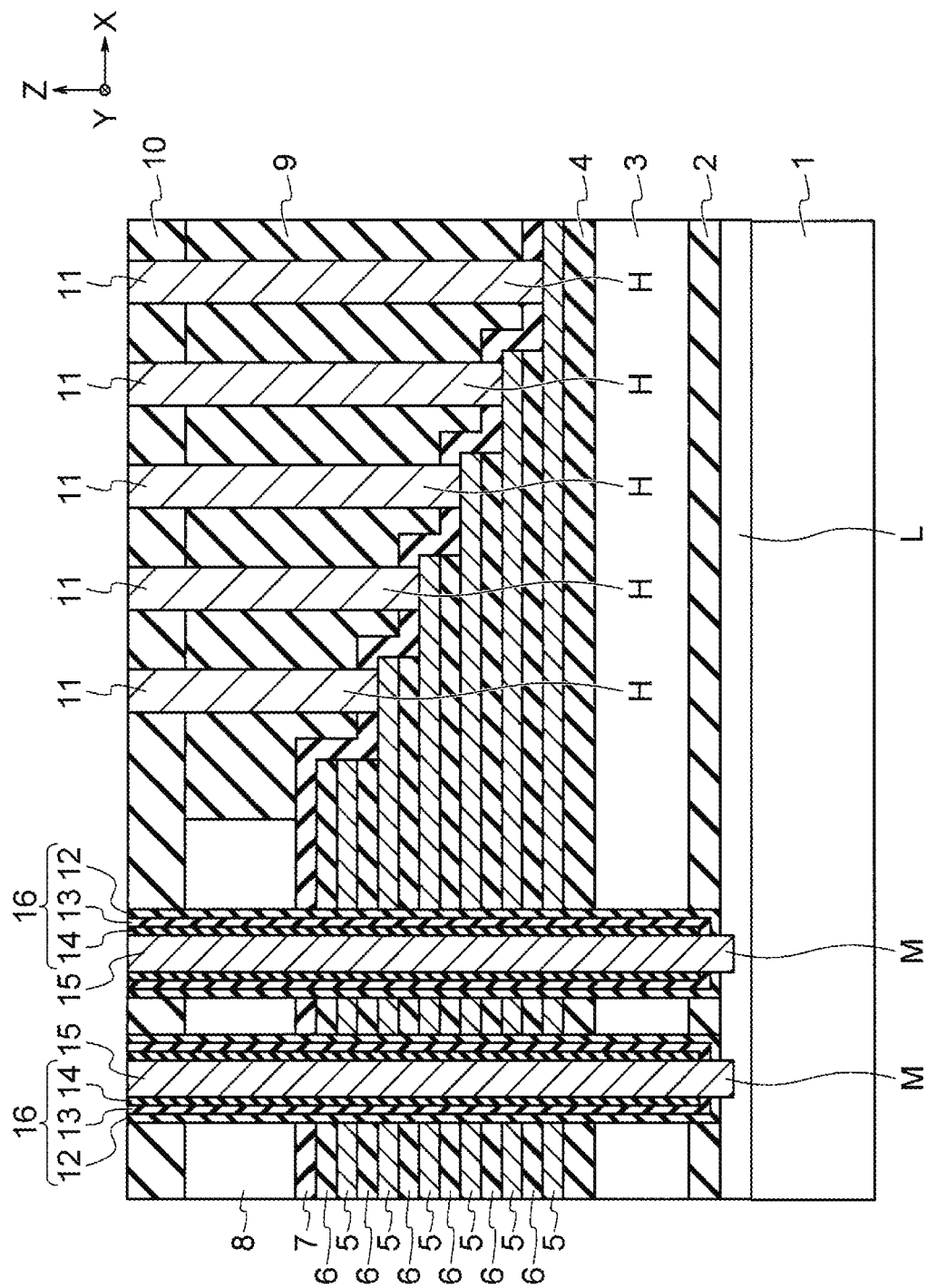
FIG. 1 is a cross-sectional view illustrating a structure of a semiconductor device according to a first embodiment.

FIG. 1 is a cross-sectional view illustrating a configuration of a semiconductor device according to a first embodiment. The semiconductor device illustrated in FIG. 1 includes a three-dimensional semiconductor memory.

The semiconductor device illustrated in FIG. 1 includes a substrate 1, a first insulating film 2, a source-side conductive layer 3, a second insulating film 4, a plurality of electrode layers 5, a plurality of insulating layers 6, a third insulating film 7, a drain-side conductive layer 8, a first interlayer insulating film 9, a second interlayer insulating film 10, a plurality of contact plugs 11, a first memory insulating film 12, a charge storage layer 13, a second memory insulating film 14, and a channel semiconductor layer 15.

An example of the substrate 1 is a semiconductor substrate such as a silicon substrate. FIG. 1 illustrates an X direction and a Y direction which are parallel to the surface of the substrate 1 and perpendicular to each other, and a Z direction perpendicular to the surface of the substrate 1. In the specification, the +Z direction is regarded as an upward direction and the −Z direction is regarded as a downward direction. The −Z direction may coincide with the direction of gravity or may not coincide with the direction of gravity.

The first insulating film 2 is formed on a diffusion layer L which is formed in the substrate 1. The source-side conductive layer 3 is formed on the first insulating film 2. The second insulating film 4 is formed on the source-side conductive layer 3.

The plurality of electrode layers 5 and the plurality of insulating layers 6 are alternately stacked on the second insulating film 4. The electrode layer 5 is, for example, a metal layer, and functions as a word line or a selection line. The number of electrode layers 5 to be stacked is, for example, 64 or more. The electrode layer 5 is an example of a first film. The insulating layer 6 is, for example, a silicon oxide film. The number of insulating layers 6 to be stacked is, for example, 64 or more. The insulating layer 6 is an example of a second film. FIG. 1 illustrates memory holes M penetrating through the electrode layers 5 and the insulating layers 6 and contact holes H formed on staircase regions of the electrode layers 5 and the insulating layers 6.

The third insulating film 7 is formed on the electrode layer 5 and the insulating layer 6. The drain-side conductive layer 8 is formed on the third insulating film 7 so as to be adjacent to the staircase region. The first interlayer insulating film 9 is formed on the third insulating film 7 so as to embed a space above the staircase region. The second interlayer insulating film 10 is formed on the drain-side conductive layer 8 and the first interlayer insulating film 9.

The plurality of contact plugs 11 are formed in the contact holes H penetrating through the third insulating film 7, the first interlayer insulating film 9, and the second interlayer insulating film 10. These contact plugs 11 are electrically connected to the different electrode layers 5. Each of the contact plugs 11 is formed of, for example, a barrier metal layer such as a titanium-containing layer and a plug material layer such as a tungsten layer.

The first memory insulating film 12, the charge storage layer 13, and the second memory insulating film 14 are sequentially formed on a side surface of the memory hole M penetrating through the first insulating film 2, the source-side conductive layer 3, the second insulating film 4, the electrode layer 5, the insulating layer 6, the third insulating film 7, the drain-side conductive layer 8, and the second interlayer insulating film 10. The first memory insulating film 12 is, for example, a silicon oxide film. The charge storage layer 13 is, for example, a silicon nitride film. The second memory insulating film 14 is, for example, a silicon oxide film. In FIG. 1, reference numeral 16 represents a memory insulating film including the first memory insulating film 12, the charge storage layer 13, and the second memory insulating film 14. However, the charge storage layer 13 may alternatively be a semiconductor layer such as a polysilicon layer.

The channel semiconductor layer 15 is formed in the memory hole M via the memory insulating film 16, and is electrically connected to the substrate 1. The channel semiconductor layer 15 is, for example, a polysilicon layer.

For example, the channel semiconductor layer 15 is formed in such a manner that the first memory insulating film 12, the charge storage layer 13, and the second memory insulating film 14 are sequentially formed on the side surface and the bottom surface of the memory hole M; the second memory insulating film 14, the charge storage layer 13, and the first memory insulating film 12 are removed from the bottom surface of the memory hole M; and then the channel semiconductor layer 15 is embedded in the memory hole M.

FIGS. 2A to 2C and FIGS. 3A to 3C are cross-sectional views illustrating a method of fabricating the semiconductor device according to the first embodiment.

Figure 2A:
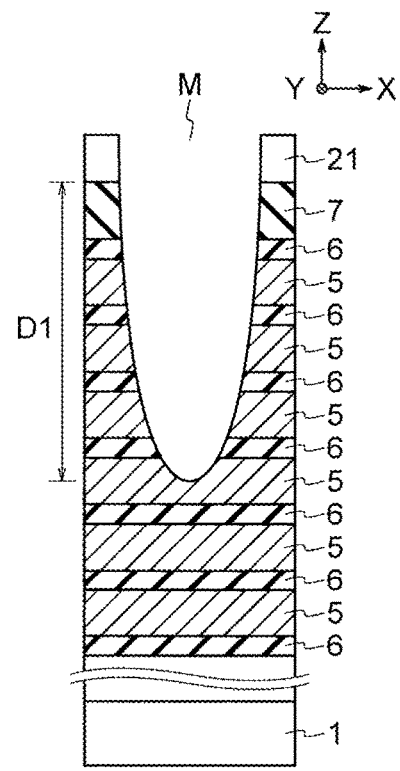
FIGS. 2A to 2C are cross-sectional views (first stage) illustrating a method of fabricating the semiconductor device according to the first embodiment.

First, the plurality of electrode layers 5 and the plurality of insulating layers 6 are alternately formed on the entire surface of the substrate 1 via the first insulating film 2, the source-side conductive layer 3, and the second insulating film 4 (see FIG. 2A). The first insulating film 2, the source-side conductive layer 3, and the second insulating film 4 are not illustrated for convenience.

Next, a mask layer 21 is formed on the entire surface of the substrate 1 via the third insulating film 7, the drain-side conductive layer 8, the first interlayer insulating film 9, and the second interlayer insulating film 10 (see FIG. 2A). The mask layer 21 is, for example, a carbon layer formed by a chemical vapor deposition (CVD). The drain-side conductive layer 8, the first interlayer insulating film 9, and the second interlayer insulating film 10 are not illustrated in FIGS. 2A to 2C for convenience.

Subsequently, the electrode layer 5 and the insulating layer 6 are etched by reactive ion etching (RIE) using the mask layer 21 to form the memory hole M in the electrode layer 5 and the insulating layer 6 (see FIG. 2A). However, there is a problem that the hole is deformed in an arcuate shape as an etching time becomes longer. Therefore, the RIE is completed before the memory hole M reaches the second insulating film 4. Reference numeral D1 represents a depth of the memory hole M from a lower surface of the mask layer 21 in the stage of FIG. 2A.

In the stage of FIG. 2A, a sacrifice layer may be formed between the insulating layers 6 instead of the electrode layer 5. The sacrifice layer is, for example, a silicon nitride film.

In this case, the sacrifice layer is removed in the subsequent stage, and the electrode layer 5 is embedded between insulating layers 6. The sacrifice layer is also an example of the second film.

Figure 2B:
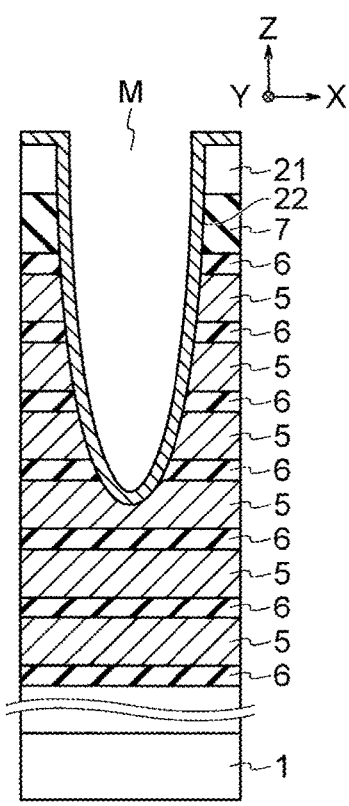

Next, a first metal layer 22 is formed on the surface of the memory hole M by CVD or ALD (Atomic Layer Deposition) (see FIG. 2B). In the first embodiment, the first metal layer 22 is formed under a condition of being conformally formed on the surface of the memory hole M. An example of the material of the first metal layer 22 is a metal material generally used as a barrier metal layer. Specifically, an example of the first metal layer 22 is a titanium nitride film (TiN), a tantalum nitride film (TaN), or a tungsten nitride film (WN).

Figure 2C:
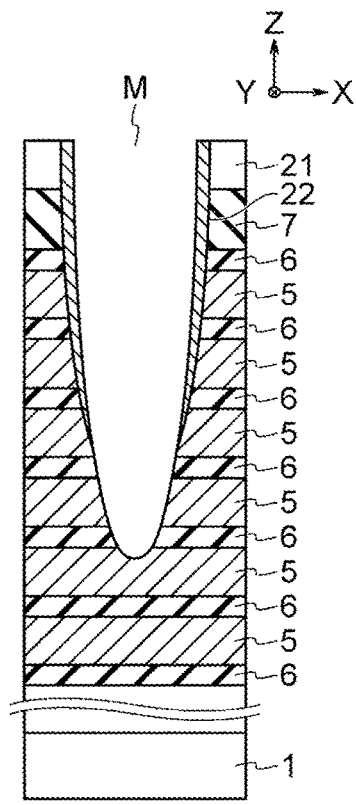

Next, the first metal layer 22 is removed from the bottom of the memory hole M by RIE (see FIG. 2C). The RIE is performed under conditions that the first metal layer 22 remains on the side surface of the memory hole M and the first metal layer 22 is removed from the bottom of the memory hole M.

Subsequently, a second metal layer 23 is formed on the surface of the first metal layer 22 by CVD or ALD (see FIG. 3A). In the first embodiment, an example of the material of the second metal layer 23 is a metal material generally used as a plug material layer or a wiring material layer. Specifically, an example of the second metal layer 23 is a tungsten (W) layer or an aluminum (Al) layer.

Generally, the barrier metal layer has a property of being capable of being etched by RIE and a property of having good adhesion with the plug material layer or the wiring material layer. For this reason, the first metal layer 22 is etched in a stage of FIG. 2C, and the second metal layer 23 is selectively formed on the surface of the first metal layer 22 in a stage of FIG. 3A. In the first embodiment, the second metal layer 23 is formed as a protective film for preventing the hole from being deformed in an arcuate shape. The first metal layer 22 of the first embodiment is formed as an adhesion film for adhering the second metal layer 23.

Figure 3A:
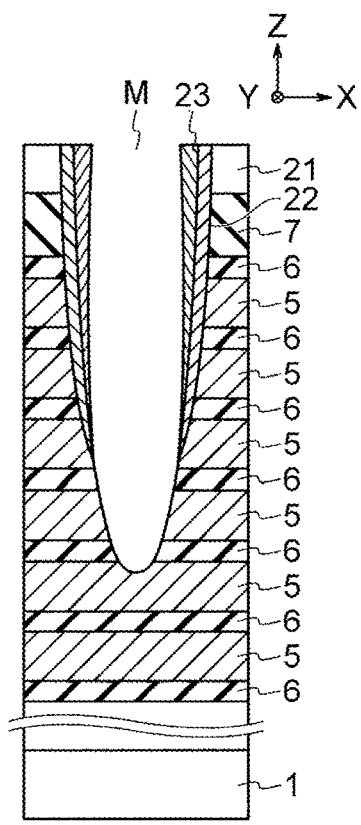
FIGS. 3A to 3C are cross-sectional views (second stage) illustrating the method of fabricating the semiconductor device according to the first embodiment.
Figure 3B:
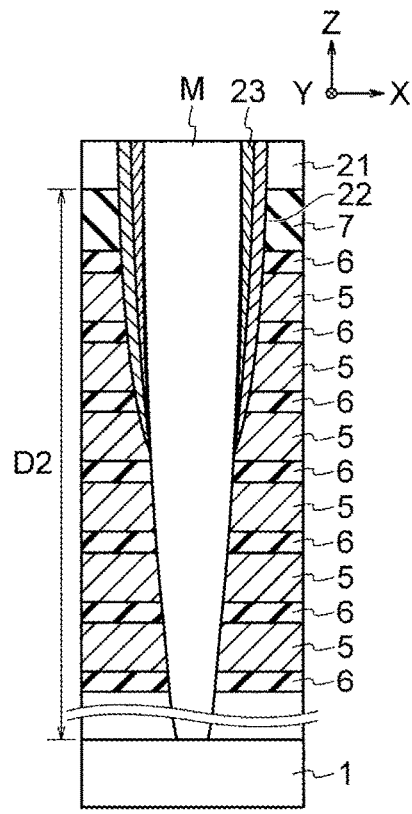

Next, the bottom of the memory hole M exposed from the first and second metal layers 22 and 23 is etched by RIE to increase the depth of the memory hole M (see FIG. 3B). At this time, since the side surface of the memory hole M is protected by the second metal layer 23, the hole is prevented from being deformed in an arcuate shape. In addition, since the second metal layer 23 does not exist on the bottom of the memory hole M, the second metal layer 23 is not obstructive to the etching of the bottom of the memory hole M. The RIE is continued until the memory hole M reaches the substrate 1. Reference numeral D2 represents a depth of the memory hole M from the lower surface of the mask layer 21 in the stage of FIG. 3B.

A ratio D1/D2 of the depth D1 and the depth D2 may be arbitrarily set. For example, it is considered that the ratio D1/D2 is set to about ¼ to ½. In the first embodiment, an etching time in the stage of FIG. 2A is adjusted so that the depth D1 becomes a desired value.

Figure 3C:
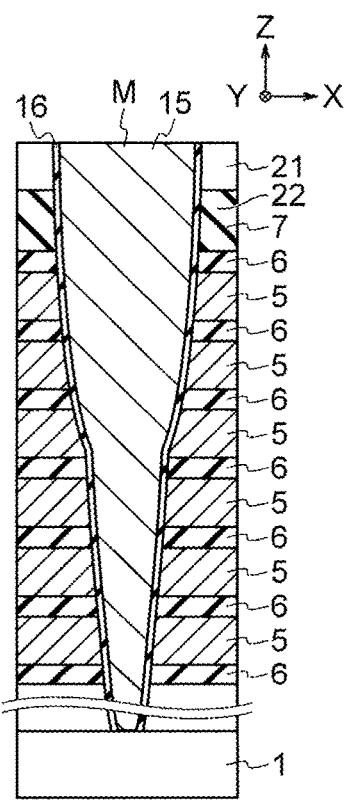

Next, the first and second metal layers 22 and 23 are removed from the memory hole M, and the memory insulating film 16 and the channel semiconductor layer 15 are sequentially formed in the memory hole M (see FIG. 3C). Specifically, the memory insulating film 16 is formed on the surface of the memory hole M, the memory insulating film 16 is removed from the bottom surface of the memory hole M, and the channel semiconductor layer 15 is formed in the memory hole M via the memory insulating film 16.

The stages of FIGS. 2A to 3C may be applied to the contact hole H instead of the memory hole M. This is effective, for example, when the contact hole H is formed to penetrate through the plurality of electrode layers 5 and the plurality of insulating layers 6.

FIG. 4 is a cross-sectional view illustrating a semiconductor device according to a comparative example of the first embodiment.

Figure 4A:
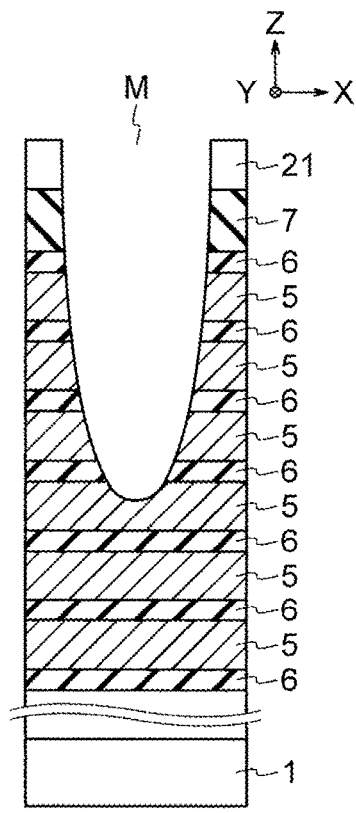
FIGS. 4A to 4C are cross-sectional views illustrating a method of fabricating a semiconductor device according to a comparative example of the first embodiment.
Figure 4B:
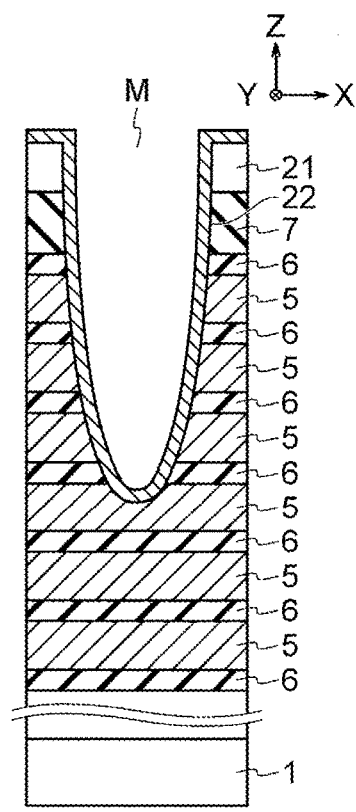
Figure 4C:
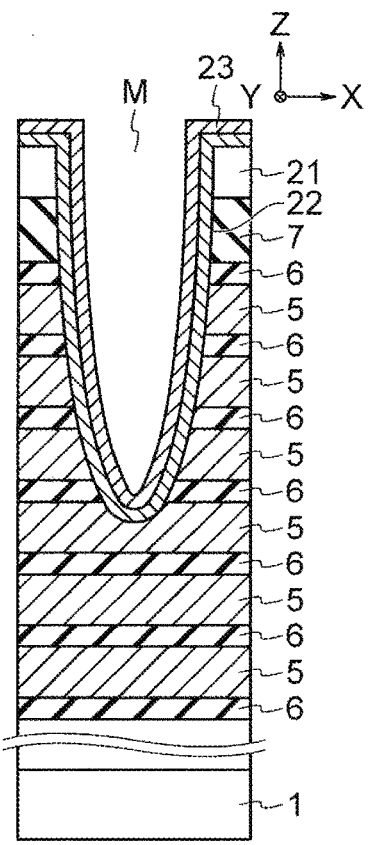

Stages of FIGS. 4A and 4B are carried out in the same way as the stages of FIGS. 2A and 2B. In a stage of FIG. 4C, however, the second metal layer 23 is formed in a state where the first metal layer 22 is not removed from the bottom of the memory hole M. Accordingly, when the thickness of the second metal layer 23 increases, there are problems that the second metal layer 23 can be hardly removed from the bottom of the memory hole M and the etching of the memory hole M can be hardly continued.

On the other hand, the second metal layer 23 of the first embodiment is selectively formed on the surface of the first metal layer 22 after the first metal layer 22 is removed from the bottom of the memory hole M (see FIGS. 2C and 3A). Therefore, the second metal layer 23 can be hardly obstructive to the etching of the memory hole M. According to the first embodiment, it is not necessary to remove the second barrier layer 23 from the bottom of the memory hole M, and the second metal layer 23 can be thickened.

Figure 5A:
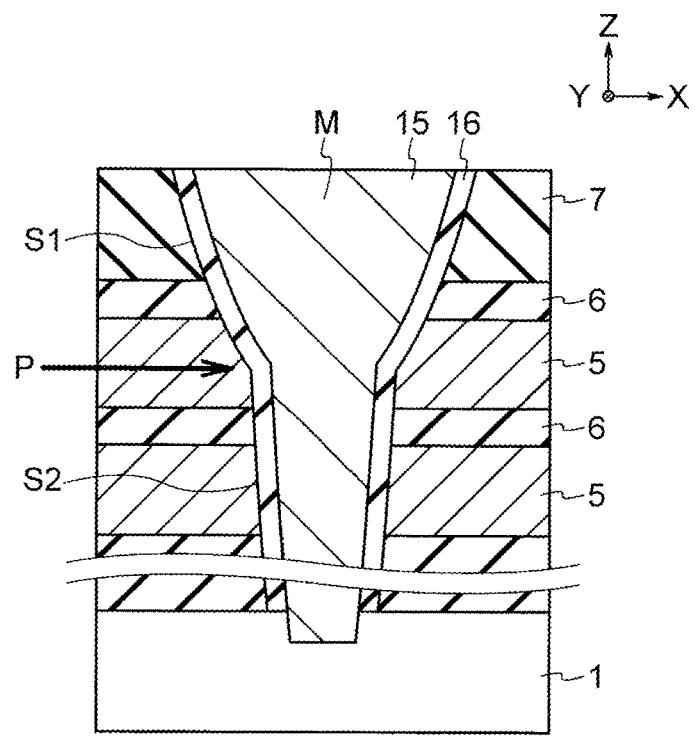
FIGS. 5A and 5B are schematic cross-sectional views for explaining in detail the method of fabricating the semiconductor device according to the first embodiment.
Figure 5B:
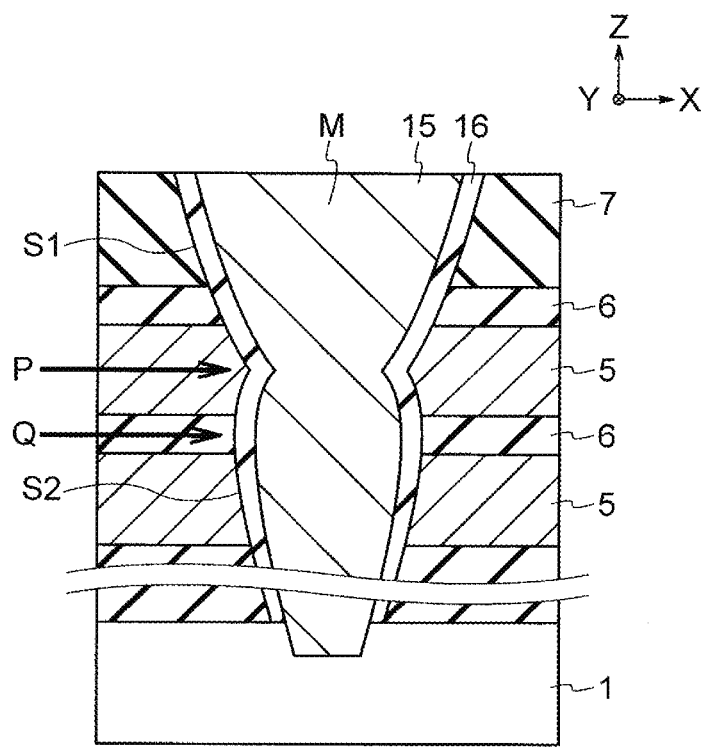

FIGS. 5A and 5B are schematic cross-sectional views for explaining the details of the fabricating method of the semiconductor device according to the first embodiment.

FIG. 5A schematically illustrates the memory hole M after the stage of FIG. 3C. The side surface of the memory hole M, that is, the side surface of the electrode layer 5 and the insulating layer 6 surrounding the channel semiconductor layer 15 and the memory insulating film 16 has a tubular shape. A diameter of the tubular shape changes depending on a depth (Z coordinate), and FIG. 5A exaggeratingly illustrates this change.

In the first embodiment, the side surface of the memory hole M includes a first side surface S1 formed by the first RIE in FIG. 2A and a second side surface S2 formed by the second RIE in FIG. 3B. Both of the first side surface S1 and the second side surface S2 have a tubular shape, and the second side surface S2 is located below the first side surface S1.

In the first embodiment, the etching of the memory hole M is switched from the first RIE to the second RIE between the first side surface S1 and the second side surface S2. Therefore, an inflection point (inflection portion) P occurs between the first side surface S1 and the second side surface S2. For example, the inflection point P can be observed as a seam line (circle) between the first side surface S1 and the second side surface S2. Further, when the seam has a width in the Z direction, a seam band (cylinder) can be observed.

FIG. 5B also schematically illustrates the memory hole M after the stage of FIG. 3C. However, FIG. 5B illustrates an example in which the second side surface S2 is formed in an arcuate shape by the second RIE. Reference numeral Q represents a depth at which the diameter of the second side surface S2 becomes maximum. The diameter at the depth Q is larger than the diameter at the inflection point P.

As described above, the side surface of the memory hole M of the first embodiment can also have the arcuate shape, but according to the first embodiment, the maximum diameter of the side surface of the memory hole M can be reduced. In the example of FIG. 5B, the maximum diameter of the first side surface S1 is a diameter at an upper end of the memory hole M (hereinafter, referred to as a "first diameter"), and the maximum diameter of the second side surface S2 is a diameter at the depth Q (hereinafter, referred to as a "second diameter"). If the memory hole M is formed without using the first and second metal layers 22 and 23, the maximum diameter of the side surface of the memory hole M is generally larger than the first diameter and the second diameter. According to the first embodiment, it is possible to reduce the maximum diameter of the side surface of the memory hole M.

In the first embodiment, the RIE may be performed three or more times to process the memory hole M. In this case, after the first and second metal layers 22 and 23 are removed from the memory hole M in the stage of FIG. 3C, the first and second metal layers 22 and 23 are formed again on the side surface of the memory hole M and a third RIE is performed. The same applies to subsequent RIE.

Figure 6:
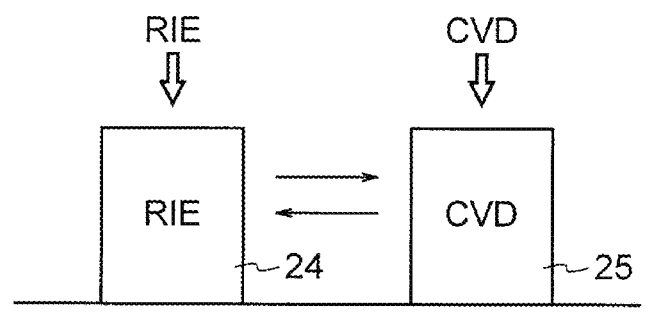
FIG. 6 is a schematic diagram for explaining the method of fabricating the semiconductor device according to the first embodiment.

FIG. 6 is a schematic diagram illustrating the method of fabricating the semiconductor device according to the first embodiment.

FIG. 6 illustrates an RIE apparatus 24 for performing RIE and a CVD apparatus 25 for performing CVD. The RIE processes in the stages of FIGS. 2A, 2C, and 3B of the first embodiment are performed in the RIE apparatus 24. On the other hand, the CVD processes in the stages of FIGS. 2B and 3A of the first embodiment are performed in the CVD apparatus 25.

In the first embodiment as described above, an ex-situ process is performed in which the RIE apparatus 24 is opened to the atmosphere during the RIE process and the first metal layer 22 and the second metal layer 23 are formed by the CVD apparatus 25. According to the first embodiment, it is possible to form the first and second metal layers 22 and 23 with good film quality, as compared with an in-situ process to be described below.

In the first embodiment as described above, the first metal layer 22 is formed on the surface of the memory hole M, the first metal layer 22 is removed from the bottom of the memory hole, and then the second metal layer 23 is formed on the surface of the first metal layer 22. This makes it possible to prevent the second metal layer 23 from obstructing the etching of the memory hole M and to reduce the maximum diameter of the side surface of the memory hole M. Further, when the maximum diameter of the side surface of the memory hole M is reduced, it is possible to improve the degree of integration of the semiconductor device and to prevent deterioration of characteristics of the semiconductor device due to the change in diameter of the memory hole M.

Therefore, according to at least one embodiment, it is possible to appropriately form a structure with a high aspect ratio such as the memory hole M and the memory structure therein.

Second Embodiment

Figure 7:
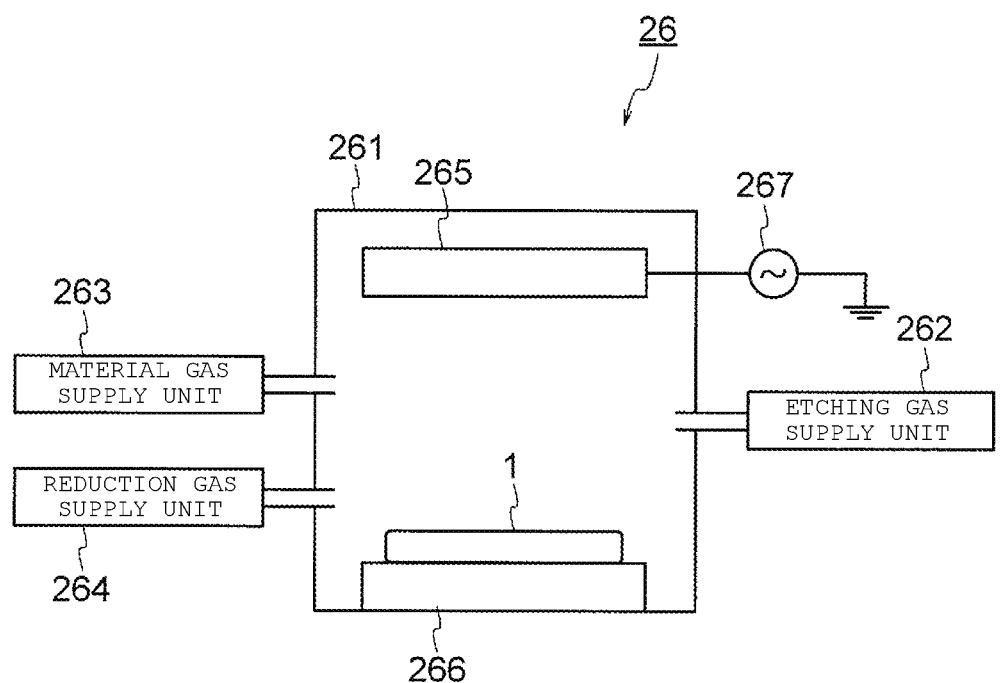
FIG. 7 is a schematic diagram for explaining a method of fabricating a semiconductor device according to a second embodiment.

FIG. 7 is a schematic diagram for explaining a method of fabricating a semiconductor device according to a second embodiment.

In the present embodiment, the RIE processes in the stages of FIGS. 2A, 2C, and 3B and the CVD processes in the stages of FIGS. 2B and 3A are performed in a semiconductor fabricating apparatus 26. That is, an in-situ process is performed in which the semiconductor fabricating apparatus 26 is not opened to the atmosphere during the RIE process and a first metal layer 22 and a second metal layer 23 are also formed in the semiconductor fabricating apparatus 26.

The semiconductor fabricating apparatus 26 illustrated in FIG. 7 includes a chamber 261, an etching gas supply unit 262, a material gas supply unit 263, a reduction gas supply unit 264, an upper electrode 265, a lower electrode 266 and a high-frequency power supply 267.

In the chamber 261, a substrate 1 is placed on the lower electrode 266. In addition, in the chamber 261, the upper electrode 265 is placed above the lower electrode 266. The high-frequency power supply 267 is connected to the upper electrode 265. The high-frequency power supply 267 outputs a high-frequency voltage, thereby generating plasma between the upper electrode 265 and the lower electrode 266. In addition, a method of generating plasma in the chamber 261 is not limited to the method illustrated in FIG. 7 and other methods may be used.

The etching gas supply unit 262 supplies etching gas for etching an electrode layer 5 and an insulating layer 6 into the chamber 261. The material gas supply unit 263 supplies material gas including a metal material of each of the first metal layer 22 and the second metal layer 23 into the chamber 261. The reduction gas supply unit 264 supplies, into the chamber 261, reduction gas for reducing metal in the material gas.

Hereinafter, a method of fabricating a semiconductor device according to the second embodiment will be described. Here, stages after RIE using a mask layer 21 will be described.

At the start of RIE, the substrate 1, on which the electrode layer 5, the insulating layer 6, and the mask layer 21 are formed, is placed on the lower electrode 266 in the chamber 261. In addition, in the chamber 261, plasma occurs between the upper electrode 265 and the lower electrode 266. In this state, the etching gas supply unit 262 supplies etching gas into the chamber 261. The etching gas is turned into plasma in the chamber 261, and the electrode layer 5, and the insulating layer 6 are etched based on the pattern of the mask layer 21. Therefore, a memory hole M which is an example of a concave portion is formed (FIG. 2A).

Subsequently, the first metal layer 22 functioning as a barrier metal layer is formed on a surface of the memory hole M by CVD (FIG. 2B). Specifically, the material gas supply unit 263 supplies material gas including the metal material of the first metal layer 22 into the chamber 261, and the reduction gas supply unit 264 supplies reduction gas for reducing the metal material into the chamber 261. In this stage, the material gas and the reduction gas are alternately supplied to the chamber 261 until the first metal layer 22 is formed with a predetermined thickness.

Next, the first metal layer 22 is removed from the bottom of the memory hole M by RIE (FIG. 2C). Specifically, the etching gas supply unit 262 supplies etching gas into the chamber 261. This stage is performed under conditions that the first metal layer 22 remains on the side surface of the memory hole M and the first metal layer 22 is removed from the bottom of the memory hole M.

Subsequently, the second metal layer 23 functioning as a protective film is formed on a surface of the first metal layer 22 by CVD (FIG. 3A). Specifically, the material gas supply unit 263 supplies the material gas (first gas) including the metal material of the second metal layer 23 into the chamber 261, and the reduction gas supply unit 264 supplies reduction gas (second gas) for reducing the metal material into the chamber 261.

The material gas may include at least one of tungsten hexafluoride ($WF_6$) gas, tungsten hexachloride ($WCl_6$), tungsten hexacarbonyl ($W(CO)_6$), molybdenum hexafluoride ($MoF_6$) gas, molybdenum hexachloride ($MoCl_6$), molybdenum hexacarbonyl ($Mo(CO)_6$), aluminum chloride ($AlCl_3$), trimethylaluminum ($Al(CH_3)_3$), titanium tetrachloride ($TiCl_4$), tantalum pentachloride ($TaCl_5$), platinum hexafluoride ($PtF_6$) gas, rhenium hexafluoride ($ReF_6$) gas, or iridium hexafluoride ($IrF_6$).

In addition, the reduction gas may include at least, for example, one of hydrogen ($H_2$) gas, hydrogen fluoride (HF) gas, hydrogen chloride (HCl) gas, hydrogen bromide (HBr) gas, water vapor ($H_2O$), hydrogen sulfide ($H_2S$), hydrogen selenide ($H_2Se$) gas, ammonia ($NH_3$) gas, phosphine ($PH_3$) gas, arsine ($AsH_3$) gas, methane ($CH_4$) gas, monosilane ($SiH_4$) gas, disilane ($Si_2H_6$) gas, diborane ($B_2H_6$) gas, oxygen ($O_2$) gas, nitrogen ($N_2$) gas, nitrogen monoxide (NO) gas, nitrogen dioxide ($NO_2$) gas, dinitrogen monoxide ($N_2O$), carbon monoxide (CO) gas, carbon dioxide ($CO_2$) carbonyl sulfide (COS) gas, sulfur monoxide (SO) gas, or sulfur dioxide ($SO_2$) gas.

In this stage, the material gas and the reduction gas are alternately supplied into the chamber 261 until the second metal layer 23 is formed with a predetermined thickness. Further, when the reduction gas is supplied, plasma occurs in the chamber 261. As a result, the reduction gas is excited by plasma. Therefore, even when the internal temperature of the chamber 261 is low, the second metal layer 23 can be stably formed.

Subsequently, the bottom of the memory hole M exposed from the first and second metal layers 22 and 23 is etched by RIE to increase the depth of the memory hole M (FIG. 3B). Specifically, the etching gas supply unit 262 supplies etching gas into the chamber 261. At this time, since the side surface of the memory hole M is protected by the second metal layer 23, the shape of the hole is prevented from being deformed in an arcuate shape.

In addition, since the second metal layer 23 does not exist on the bottom of the memory hole M, the etching of the bottom of the memory hole M due to the second metal layer 23 is avoided. The RIE is continued until the memory hole M reaches the substrate 1. Thereafter, the same stages as the first embodiment are performed and thus a description thereof will be omitted.

According to at least one embodiment, CVD and RIE are performed in the same chamber 261. Therefore, as in the first embodiment, it is not necessary to transfer the substrate 1 between the RIE apparatus 24 and the CVD apparatus 52. Accordingly, it is possible to shorten the processing time. This merit increases as the number of times of performing RIE to process the memory hole M is increased.

In addition, in at least one embodiment and the first embodiment, the film to be processed is a stacked body in which the electrode layer 5 and the insulating layer 6 are alternately stacked. However, the film to be processed is not limited to such a stacked body, and may be a single-layer body.

In addition, when adhesion between the film to be processed and the second metal layer 23 can be sufficiently ensured, the first metal layer 22 may not be formed.

Third Embodiment

Figure 8:
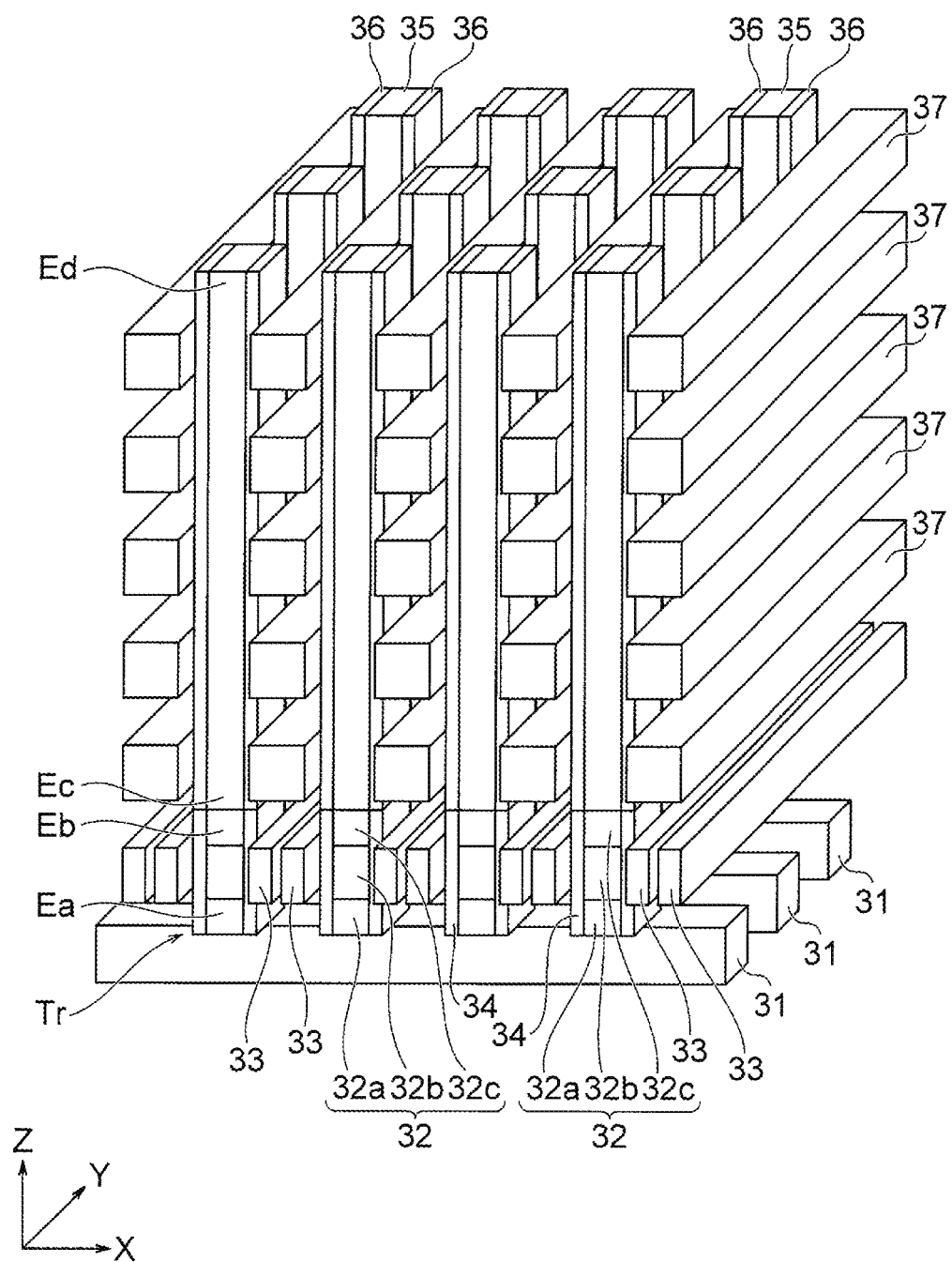
FIG. 8 is a perspective view illustrating a structure of a semiconductor device according to a third embodiment.

FIG. 8 is a perspective view illustrating a structure of a semiconductor device according to a third embodiment. In FIG. 8, the semiconductor device includes a resistive random access memory (ReRAM).

In FIG. 8, the semiconductor device includes a plurality of global bit lines 31. These global bit lines 31 may be formed by, for example, a part of a silicon substrate, or may be formed of a polysilicon layer provided on the silicon substrate with an insulating film interposed therebetween. Similar to FIG. 1, FIG. 8 illustrates the X direction and the Y direction parallel to the surface of the substrate and perpendicular to each other and the Z direction perpendicular to the surface of the substrate. The global bit lines 31 extend in the X direction.

On each of the global bit lines 31, a plurality of semiconductor members 32 are formed. These semiconductor members 32 are arranged in a matrix form along the X direction and the Y direction. Reference characters Ea and Eb respectively represent a lower end and an upper end of each semiconductor member 32. The lower end Ea of each semiconductor member 32 is electrically connected to one global bit line 31. Each of the semiconductor members 32 includes an n-type portion 32a formed on one global bit line 31, a p-type portion 32b formed on the n-type portion 32a, and an n-type portion 32c formed on the p-type portion 32b.

The semiconductor device illustrated in FIG. 8 further includes a plurality of gate electrodes 33 extending in the Y direction between the semiconductor members 32. Each of the gate electrodes 33 is provided on an upper part of the n-type portion 32a, the entire of p-type portion 32b, and a lower side surface in the +X direction or a lower side surface in the −X direction of the n-type portion 32c, via a gate insulating film 34.

The gate insulating film 34 is formed on the side surface in the +X direction and the side surface in the −X direction of each semiconductor member 32. As indicated by reference numeral Tr, an n-channel type TFT (Thin Film Transistor) is configured with one semiconductor member 32, a pair of gate electrodes 33, and the gate insulating film 34 between the semiconductor member and the gate electrodes.

On each of the semiconductor members 32, one local bit line 35 having a pillar shape and extending in the Z direction is formed. The local bit line 35 is formed of, for example, a titanium nitride film. Reference characters Ec and Ed respectively represent a lower end and an upper end of each local bit line 35. The lower end Ec of each local bit line 35 is electrically connected to the upper end Eb of one semiconductor member 32.

On the side surface in the +X direction and the side surface in −X direction of each local bit line 35, a variable resistance film 36 is formed. The variable resistance film 36 is a film having a resistance state which is variable depending on the supplied voltage or current.

In FIG. 8, the semiconductor device further includes a plurality of word lines 37 extending in the Y direction between the local bit lines 35. A plurality of word lines 37 adjacent to each other in the Z direction are arranged between the local bit lines 35 adjacent to each other in the X direction. The word line 37 is formed of, for example, a titanium nitride film. The variable resistance film 36 is formed between the local bit line 35 and the word line 37.

In the third embodiment, the plurality of electrode layers including these word lines 37 and the plurality of insulating layers for electrical insulation between these electrode layers are alternately formed on the substrate. The method of forming the memory hole M described in the first embodiment is also applicable to the case of forming a hole penetrating through these electrode layers and insulating layers. In this case, the insulating layer is an example of a first film, and the electrode layer is an example of a second film.

According to the third embodiment, it is possible to appropriately form a structure with a high aspect ratio in the ReRAM.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of fabricating a semiconductor device, comprising:
   forming alternately a plurality of first films and a plurality of second films on a substrate;
   forming a hole in the first and second films;
   forming a first metal layer on a surface of the hole;
   removing the first metal layer from a bottom of the hole;
   forming a second metal layer on a surface of the first metal layer after removing the first metal layer from the bottom of the hole; and
   processing the bottom of the hole exposed from the first and second metal layers to increase a depth of the hole.

2. The method according to claim 1, wherein the first metal layer contains at least one of titanium, tantalum, or tungsten.

3. The method according to claim 1, wherein the second metal layer contains tungsten or aluminum.

4. The method according to claim 1, further comprising:
   removing the first and second metal layers from the hole after increasing the depth of the hole; and
   forming a conductor layer or a semiconductor layer in the hole after removing the first and second metal layers from the hole.

5. The method according to claim 1, wherein after the depth increases, the hole includes:
   a first side surface having a tubular shape; and
   a second side surface that is located below the first side surface and has a tubular shape, and
   a seam line disposed between the first side surface and the second side surface.

6. The method according to claim 5, wherein the second side surface has a maximum diameter larger than a diameter at the seam line.

7. The method according to claim 1, wherein the first and second metal layers are formed in a first apparatus, and
   the forming the hole, the removing the first metal layer from the bottom of the hole, and the processing the bottom of the hole are performed in the first apparatus or a second apparatus different from the first apparatus.

8. A semiconductor device comprising:
   a plurality of first films and a plurality of second films that are alternately disposed on a substrate; and
   a conductor layer or a semiconductor layer that is disposed in the first and second films, wherein
   the first and second films have a side surface which has a tubular shape and surrounds the conductor layer or the semiconductor layer,
   the side surface of the first and second films includes:
   a first side surface having a tubular shape, and
   a second side surface that is located below the first side surface and has a tubular shape, and
   a seam line disposed between the first side surface and the second side surface, a diameter of a bottom of the second side surface is smaller than a diameter of the seam line,
   wherein the second side surface has a maximum diameter larger than the diameter of the seam line.

9. A method of fabricating a semiconductor device, the method comprising:
- forming a film to be processed on a substrate;
- forming a concave portion in the film to be processed in a chamber;
- forming a metal layer on a portion of the concave portion in the chamber following the forming of the concave portion; and
- processing a bottom of the concave portion exposed from the metal layer in the chamber to increase a depth of the concave portion following the forming of the metal layer,
- wherein the film to be processed comprises a plurality of first films and a plurality of second films that are alternately stacked, and
- wherein when forming the metal layer, a first metal layer is formed on a surface of the concave portion, the first metal layer is removed from the bottom of the concave portion, and then a second metal layer is formed on a surface of the first metal layer.

10. The method according to claim 9, wherein
when forming the second metal layer, a first gas including a metal material of the second metal layer and a second gas for reducing the metal material are alternately supplied into the chamber.

11. The method according to claim 10, wherein
the second gas is turned into plasma.

12. The method according to claim 10, wherein the first gas includes at least one of tungsten (W), molybdenum (Mo), aluminum (Al), titanium (Ti), tantalum (Ta), platinum (Pt), rhenium (Re) or iridium (Ir).

13. The method according to claim 10, wherein
the first gas includes at least one of tungsten hexafluoride ($WF_6$) gas, tungsten hexachloride ($WCl_6$), tungsten hexacarbonyl ($W(CO)_6$), molybdenum hexafluoride ($MoF_6$) gas, molybdenum hexachloride ($MoCl_6$), molybdenum hexacarbonyl ($Mo(CO)_6$), aluminum chloride ($AlCl_3$), trimethylaluminum ($Al(CH_3)_3$), titanium tetrachloride ($TiCl_4$), tantalum pentachloride ($TaCl_5$), platinum hexafluoride ($PtF_6$) gas, rhenium hexafluoride ($ReF_6$) gas, or iridium hexafluoride ($IrF_6$).

14. The method according to claim 10, wherein
the second gas includes at least one of hydrogen (H), oxygen (O) or nitrogen (N).

15. The method according to claim 10, wherein
the second gas includes at least one of hydrogen ($H_2$) gas, hydrogen fluoride (HF) gas, hydrogen chloride (HCl) gas, hydrogen bromide (HBr) gas, water vapor ($H_2O$), hydrogen sulfide ($H_2S$), hydrogen selenide ($H_2Se$) gas, ammonia ($NH_3$) gas, phosphine ($PH_3$) gas, arsine ($AsH_3$) gas, methane ($CH_4$) gas, monosilane ($SiH_4$) gas, disilane ($Si_2H_6$) gas, diborane ($B_2H_6$) gas, oxygen ($O_2$) gas, nitrogen ($N_2$) gas, nitrogen monoxide (NO) gas, nitrogen dioxide ($NO_2$) gas, dinitrogen monoxide ($N_2O$), carbon monoxide (CO) gas, carbon dioxide ($CO_2$), carbonyl sulfide (COS) gas, sulfur monoxide (SO) gas, or sulfur dioxide ($SO_2$) gas.

16. The method according to claim 2, further comprising:
- removing the first and second metal layers from the hole after increasing the depth of the hole; and
- forming a conductor layer or a semiconductor layer in the hole after removing the first and second metal layers from the hole.

17. The method according to claim 3, further comprising:
- removing the first and second metal layers from the hole after increasing the depth of the hole; and
- forming a conductor layer or a semiconductor layer in the hole after removing the first and second metal layers from the hole.

18. The method according to claim 11, wherein
the second gas includes at least one of hydrogen (H), oxygen (O) or nitrogen (N).

* * * * *